(12) United States Patent
He et al.

(10) Patent No.: US 12,253,585 B2
(45) Date of Patent: Mar. 18, 2025

(54) COIL DECOUPLING FOR MAGNETIC RESONANCE IMAGING

(71) Applicant: Siemens Healthcare GmbH, Erlangen (DE)

(72) Inventors: Jia Lin He, Shenzhen (CN); Zhi Bin Li, Shenzhen (CN); Qiu Yi Zhang, Shenzhen (CN)

(73) Assignee: Siemens Healthineers AG, Erlangen (DE)

( * ) Notice: Subject to any disclaimer, the term of this patent is extended or adjusted under 35 U.S.C. 154(b) by 0 days.

(21) Appl. No.: 17/955,821

(22) Filed: Sep. 29, 2022

(65) Prior Publication Data

US 2023/0094917 A1    Mar. 30, 2023

(30) Foreign Application Priority Data

Sep. 29, 2021  (CN) .......................... 202111148715.8

(51) Int. Cl.
*G01R 33/36*  (2006.01)
(52) U.S. Cl.
CPC ................................. *G01R 33/365* (2013.01)
(58) Field of Classification Search
CPC ............. G01R 33/365; G01R 33/3415; G01R 33/3642; G01R 33/3657
See application file for complete search history.

(56) References Cited

U.S. PATENT DOCUMENTS

| | | | | |
|---|---|---|---|---|
| 5,483,158 | A | * | 1/1996 | van Heteren ...... G01R 33/3628 324/318 |
| 2015/0346295 | A1 | * | 12/2015 | Reykowski ........ G01R 33/3614 324/322 |

OTHER PUBLICATIONS

Gruber et al., RF Coils: A Practical Guide for Nonphysicists, J. Magn. Reson. Imaging 2018;48:590-604 (Year: 2018).*
Fundamentals of RF and Microwave Power Measurements, Application Note 64-1B, Agilent Technologies, 2000 (Year: 2000).*

* cited by examiner

*Primary Examiner* — Daniel R Miller
(74) *Attorney, Agent, or Firm* — Banner & Witcoff Ltd.

(57) ABSTRACT

A coil decoupling method for a magnetic resonance imaging device, including: sending an instruction causing a transmitter to send a transmitted signal, acquiring a received signal received by a receiver, wherein the received signal is a signal arriving at the receiver after the transmitted signal passes through two coils to be adjusted of a plurality of coils, determining the coupling value between the two coils to be adjusted based on the transmitted signal and the received signal, and sending an instruction for adjusting a decoupling component based on the coupling value.

14 Claims, 7 Drawing Sheets

COIL DECOUPLING FOR MAGNETIC RESONANCE IMAGING

TECHNICAL FIELD

The disclosure relates to the technical field of medical devices, in particular to a coil decoupling method and apparatus for a magnetic resonance imaging device, a non-transient computer-readable storage medium, and a computer program product.

BACKGROUND ART

A magnetic resonance imaging device utilizes the principle of nuclear magnetic resonance and different attenuations of a released energy in different internal structure environments of a substance to obtain the position and the type of the nucleus of the substance through monitoring the electromagnetic wave emitted from the gradient magnetic field.

A superconducting magnet is the core component of a magnetic resonance imaging device and the magnetic resonance imaging device utilizes superconducting coils made of a superconducting material to generate a high-strength and high-stability magnetic field. Coils of existing magnetic resonance imaging devices are mainly designed as array coils, that is to say, a plurality of coils form a coil array through a specific array arrangement. Coils arranged in an array will interfere with each other because of the existence of magnetic field coupling. When the degree of coupling between coils is greater than a certain value, the efficiency of the coil array and the parallel imaging performance will be influenced to some extent. Therefore, coil decoupling is critical to a magnetic resonance imaging device.

For a magnetic resonance system, especially for a low-field magnetic resonance system, the coupling phenomenon also exists between coils separated far away from each other because of a high Q-factor of the coils. In addition, coil coupling may be influenced by loads, so decoupling results may also be different under different loads. However, existing coil decoupling methods cannot achieve a good decoupling effect.

SUMMARY OF THE DISCLOSURE

In view of this, the disclosure provides a coil decoupling method for a magnetic resonance imaging device in a first aspect for effective and real-time decoupling of coils and alleviating the influence of the factors such as load on the decoupling effect, thus improving the imaging performance.

According to the first aspect of the disclosure, a coil decoupling method for a magnetic resonance imaging device is provided. The magnetic resonance imaging device comprises a transmitter, a receiver, a decoupling component and a plurality of coils. The method comprises: sending an instruction causing the transmitter to send a transmitted signal, acquiring a received signal received by the receiver, wherein the received signal is the transmitted signal arriving at the receiver after passing through two coils to be adjusted of the plurality of coils, determining the coupling value between the two coils to be adjusted based on the transmitted signal and the received signal, and sending an instruction for adjusting the decoupling component based on the coupling value.

According a second aspect of the disclosure, a coil decoupling apparatus for a magnetic resonance imaging device is provided. The magnetic resonance imaging device comprises a transmitter, a receiver, a decoupling component and a plurality of coils. The coil decoupling apparatus comprises: a first sending module, the first sending module being configured to send an instruction causing the transmitter to send a transmitted signal; an acquisition module, the acquisition module being configured to acquire a received signal received by the receiver, wherein the received signal is the transmitted signal arriving at the receiver after passing through two coils to be adjusted of the plurality of coils; a determination module, the determination module being configured to determine the coupling value between the two coils to be adjusted based on the transmitted signal and the received signal; and a second sending module, the second sending module being configured to send an instruction for adjusting the decoupling component based on the coupling value.

According to a third aspect of the disclosure, an electronic device is provided. The electronic device comprises a processor and a memory storing a program. The program comprises instructions and the instructions cause the processor to execute the coil decoupling method for a magnetic resonance imaging device according to the disclosure when executed by the processor.

According to a fourth aspect of the disclosure, a non-transient computer-readable storage medium storing a program is provided. The program comprises instructions and the instructions cause one or more processors to execute the coil decoupling method for a magnetic resonance imaging device according to the disclosure when executed by the one or more processors.

According a fifth aspect of the disclosure, a computer program product is provided. The computer program product comprises a computer program and the computer program performs the steps of the coil decoupling method for a magnetic resonance imaging device according to the disclosure.

According to the embodiments of the disclosure, the coupling degree between coils is calculated based on the transmitted signal and the received signal passing through coils, and the decoupling component in the magnetic resonance imaging device is adjusted according to the degree of coupling, so that the coils are effectively decoupled in real time, and the influence of the factors such as load on the decoupling effect is reduced, and thus the magnetic resonance imaging performance is improved.

DESCRIPTION OF THE DRAWINGS

The embodiments of the disclosure will be described in detail below by referring to the drawings so that those skilled in the art can have a clearer idea of the above-mentioned and other characteristics and advantages of the disclosure. In the drawings.

SPECIFIC EMBODIMENTS

Figure 1:
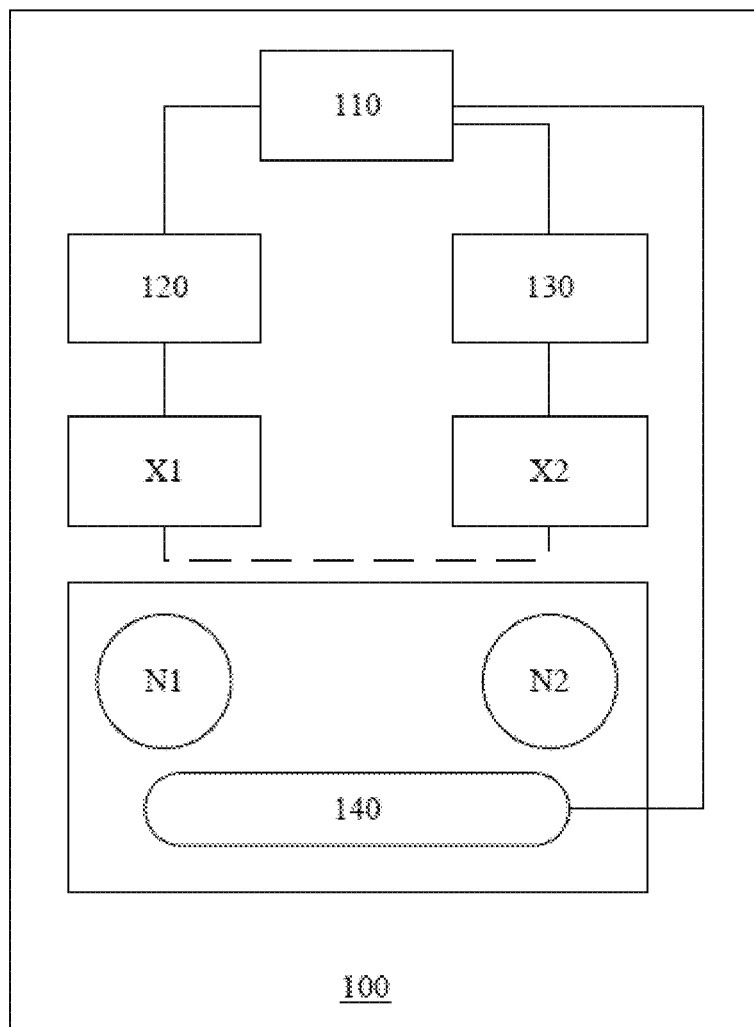
FIG. 1 is a schematic diagram of the magnetic resonance system for a magnetic resonance imaging device according to some embodiments of the disclosure.

To help understand more clearly the technical characteristics, objectives, and effects of the disclosure, specific embodiments of the disclosure are described below by referring to the drawings in which the same reference numeral represents the same part.

In this document, "schematic" means "acting as an instance, example, or illustration", and any schematic illustration or embodiment described in this document should not be interpreted as a more preferred or advantageous technical solution.

In this document, "one" not only represents "only one", but also may represent "more than one". In this document, "first" and "second" are used only to distinguish from each other, but do not represent their importance or sequence, or a prerequisite for their mutual existence, etc.

For a magnetic resonance system, especially for a low-field magnetic resonance system, the coupling phenomenon also exists between coils separated far away from each other because of a high Q-factor of the coils. In addition, coil coupling may be influenced by loads, so decoupling results may also be different under different loads. In related technologies, geometric coincidence (superimposing magnetic fields through operations) is used for decoupling to offset the magnetic fields in the positive and negative directions so that the mutual inductance between two coils is zero. In addition, inductance decoupling or capacitance decoupling may be used. However, for a decoupling mode (for example, geometric coincidence, inductance decoupling, or capacitance decoupling) in related technologies, complicated adjustments are made to the parameters of the components such as coils, capacitors or inductors during the manufacturing process. Furthermore, the parameters of the components, once manufactured, are fixed and cannot vary with the load of a magnetic resonance imaging device. The decoupling mode in related technologies puts forward higher requirements for the coil decoupling design and increases the difficulty of the coil design. In addition, because of structural differences between objects under test, pre-adjusted decoupling is not necessarily applicable to all application scenarios when a magnetic resonance device works.

According to the embodiments of the disclosure, the degree of coupling between coils is calculated based on the transmitted signal and the received signal passing through coils, and the decoupling component in the magnetic resonance imaging device is adjusted according to the degree of coupling, so that the coils are effectively decoupled in real time, and the influence of the factors such as load on the decoupling effect is reduced, and thus the magnetic resonance imaging performance is improved.

Exemplary embodiments of the disclosure are described in detail below in combination with the drawings.

FIG. 1 is a schematic diagram of the magnetic resonance system 100 for a magnetic resonance imaging device according to some embodiments of the disclosure. As shown in FIG. 1, the magnetic resonance system 100 may comprise a controller 110, a transmitter 120, a receiver 130, a decoupling component 140 and a plurality of coils (for example, coil N1 and coil N2). In some embodiments, the magnetic resonance system 100 may further comprise a plurality of channel selection portions, for example, channel selection portion X1 and channel selection portion X2, wherein the controller 110 is in communication connection with the transmitter 120, the receiver 130 and/or the channel selection portions N1, N2 to control the operations of the transmitter 120, the receiver 130 and/or the channel selection portions. In this document, "communication connection", which may be a wired connection or a wireless connection, is used to transmit signals, for example, a control signal or a sensing signal. In some embodiments, the controller 110 may also be in communication connection with the decoupling component 140 so as to control the operations and parameters of the decoupling component 140, wherein, the decoupling component 140 may be a capacitor (for example, a voltage controlled capacitor), an inductor or a resistor, etc. The decoupling component 140 may be arranged between the coil N1 and the coil N2, or in the coil N1 or the coil N2. In some embodiments, the channel selection portions X1, X2 may be configured to selectively connect or disconnect the corresponding coils N1, N2 to/from the transmitter 120 or the receiver 130. In some embodiments, the transmitter 120 may selectively send a transmitted signal to the coil N1 or the coil N2. For example, when the channel selection portion X1 connects the coil N1 to the transmitter 120, the transmitter 120 sends the transmitted signal to the coil N1, and the coil N1 may serve as a transmitting coil to transmit the signal sent by the transmitter 120. When the channel selection portion X2 connects the coil N2 to the receiver 130, the coil N2 may serve as a receiving coil to receive the signal transmitted by the transmitting coil. In addition, via the control of the controller over the channel selection portions X1, X2, the transmitter 120 and the receiver 130, the coil N1 may serve as a receiving coil and the coil N2 may serve as a transmitting coil.

Figure 2:
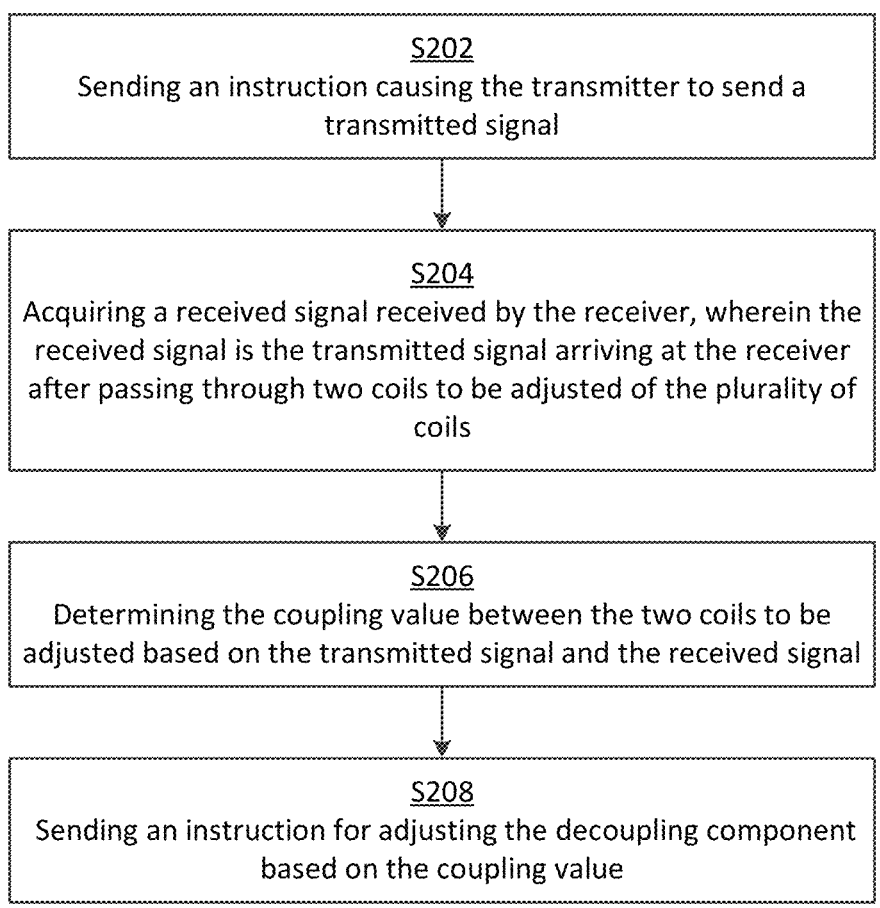
FIG. 2 is a flowchart of the coil decoupling method for a magnetic resonance imaging device according to some embodiments of the disclosure.

FIG. 2 is a flowchart of the coil decoupling method 200 for a magnetic resonance imaging device according to some embodiments of the disclosure. As shown in FIG. 2, the method 200 comprises: Step S202, sending an instruction causing the transmitter to send a transmitted signal; Step S204, acquiring a received signal received by the receiver, wherein the received signal is the transmitted signal arriving at the receiver after passing through two coils to be adjusted of the plurality of coils; Step 206, determining the coupling value between the two coils to be adjusted based on the transmitted signal and the received signal; and Step 208, sending an instruction for adjusting the decoupling component based on the coupling value.

The steps of the method 200 are described in detail below in combination with FIG. 1.

In Step S202, an instruction causing the transmitter to send a transmitted signal is sent.

For example, the controller 110 may send an instruction causing the transmitter 120 to send a transmitted signal, and the channel selection portion X1 may connect the coil N1 to the transmitter 110 under the control of the controller 110. In this case, the coil N1 serves as a transmitting coil. The transmitter 120 sends a transmitted signal after receiving the instruction sent by the controller 110, and the transmitted signal is transmitted to the coil N1 via the channel selection portion X1 and is sent by the coil N1. The frequency of the transmitted signal is generally configured to be consistent with the frequency (for example, 63.6 MHz in a 1.5 T system) of a magnetic resonance signal, which ensures the transmission efficiency of the whole signal.

In Step S204, a received signal received by the receiver is acquired.

For example, the controller 110 may acquire a received signal received by the receiver 130. The received signal is the transmitted signal arriving at the receiver 130 after passing through two coils to be adjusted (for example, the coil N1 and the coil N2). In this case, the channel selection portion X2 may connect the coil N2 to the receiver 130 under the control of the controller 110. The coil N2 may serve as a receiving coil to receive a signal sent by the coil N1 serving as a transmitting coil and the signal is transmitted to the receiver 130 via the channel selection portion X2.

In Step S206, the coupling value between the two coils to be adjusted is determined based on the transmitted signal and the received signal.

For example, the controller 110 may determine the coupling value between two coils to be adjusted (for example, the coil N1 and the coil N2) based on the transmitted signal and the received signal after acquiring the transmitted signal and the received signal. The coupling value represents the degree of coupling between two coils to be adjusted (for example, the coil N1 and the coil N2).

In Step 208, an instruction for adjusting the decoupling component based on the coupling value is sent.

Figure 4:
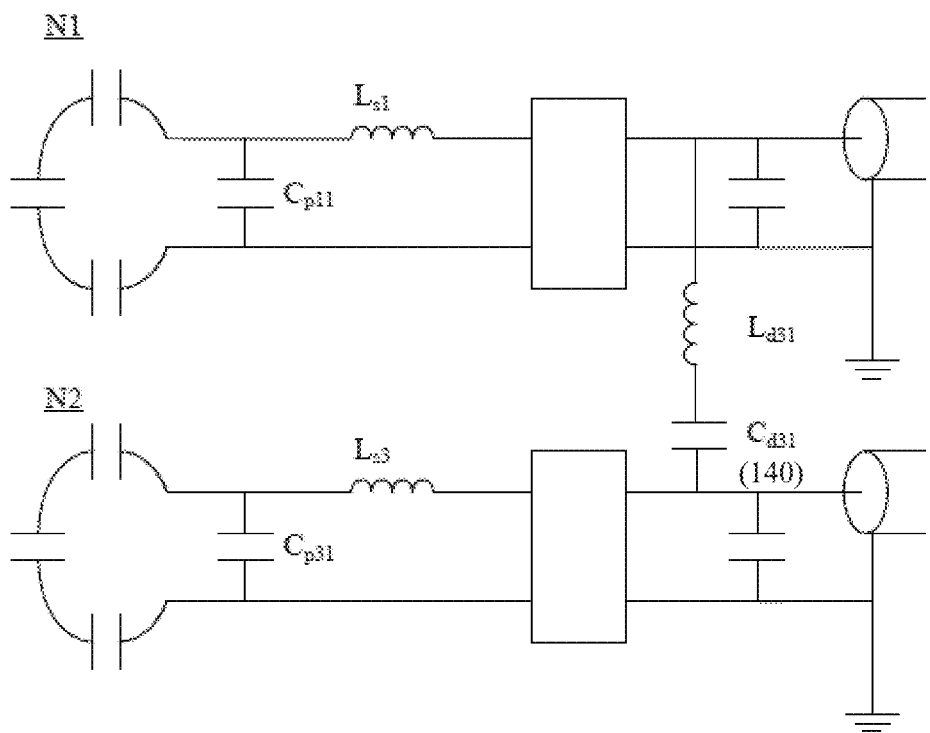
FIG. 4 is a schematic diagram of the internal structure of some coils in FIG. 3.

For example, after determining the coupling value between two coils to be adjusted (for example, the coil N1 and the coil N2), the controller 110 may send an instruction for adjusting the decoupling component 140 based on the coupling value to adjust the parameters of the decoupling component 140 in real time. Specifically, when the decoupling component 140 is a voltage-controlled capacitor, the controller 110 may determine the control voltage of the voltage-controlled capacitor based on the coupling value and send an instruction containing the control voltage to the decoupling component 140. In some embodiments, for example, as shown in FIG. 4, the decoupling component 140 may be a decoupling component (for example, the capacitor $C_{d31}$) arranged between the coil N1 and the coil N2, and thus coils can be decoupled efficiently and accurately. In other embodiments, the decoupling component 140 may be an inductor $L_{d31}$ arranged between the coil N1 and the coil N2, or a capacitor $C_{p11}$ or $C_{p31}$ or an inductor $L_{s1}$ or $L_{s3}$ etc. provided in the coil N1 or the coil N2, or a combination of capacitors and inductors between the coil N1 and the coil N2 or in the two coils. The decoupling component of the disclosure is not limited to those listed herein.

In the above-mentioned embodiments, the degree of coupling between coils is calculated based on the transmitted signal and the received signal passing through coils, and the decoupling component in the magnetic resonance imaging device is adjusted according to the degree of coupling, so that the coils are effectively decoupled in real time, and the influence of the factors such as load on the decoupling effect is reduced, and thus the magnetic resonance imaging performance is improved.

Figure 3:
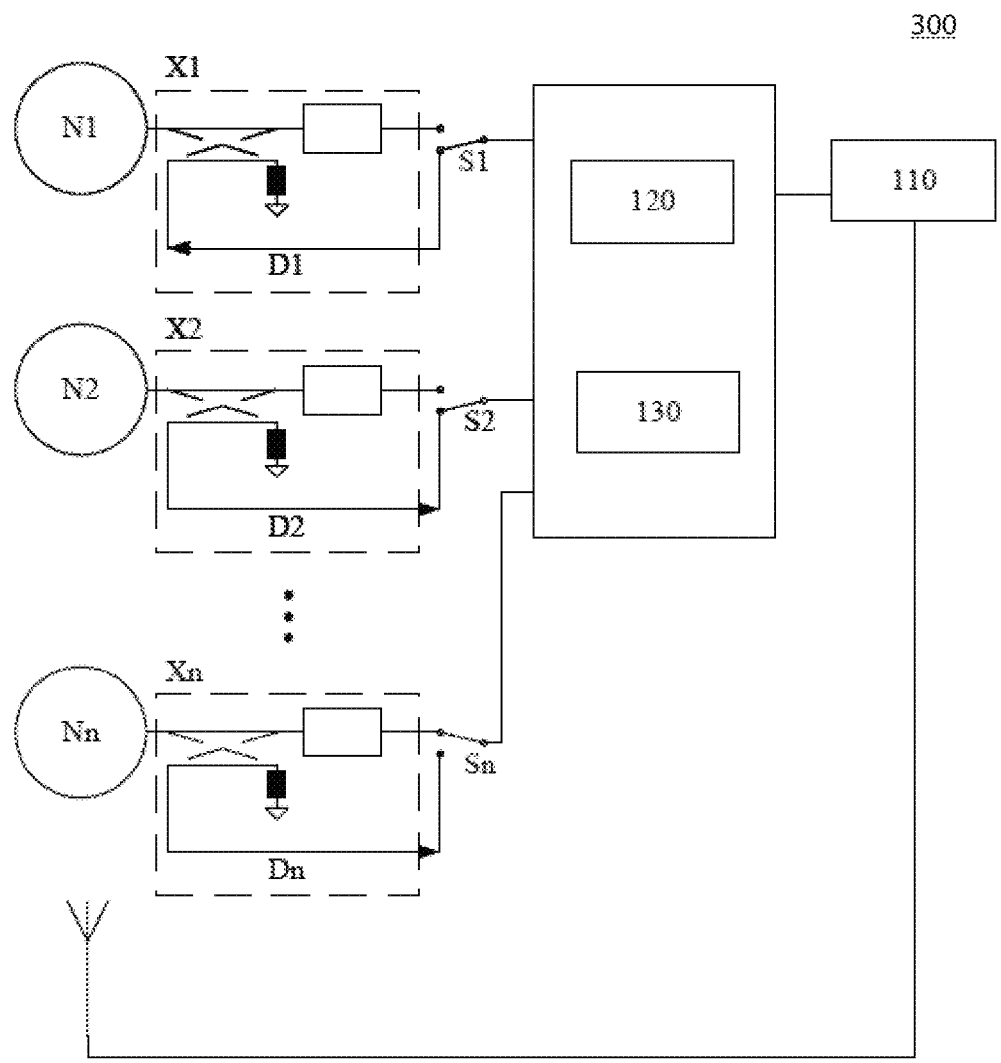
FIG. 3 is a schematic diagram of the magnetic resonance system for a magnetic resonance imaging device according to other embodiments of the disclosure.

In some embodiments, before Step S202, the method 200 may further comprise selecting two coils from the plurality of coils as the two coils to be adjusted based on the coupling degree between two adjacent coils of the plurality of coils, wherein one coil to be adjusted of the two coils to be adjusted is a transmitting coil for receiving a transmitted signal sent by the transmitter, and the other coil to be adjusted of the two coils to be adjusted is a receiving coil for receiving a signal sent by the transmitting coil, and sending an instruction for connecting the transmitting coil to the transmitter and connecting the receiving coil to the receiver. For example, in the system shown in FIG. 3, the magnetic resonance imaging system 300 shown in FIG. 3 comprises a plurality of coils N1, N2, . . . , Nn and a plurality of channel section portions X1, X2, . . . , Xn. The plurality of channel selection portions X1, X2, . . . , Xn respectively comprise the switches S1, S2, . . . , Sn and the couplers D1, D2, . . . , Dn, wherein each coupler of the plurality of couplers D1, D2, . . . , Dn may comprise two channels, one of which is used for transmitting data when a human body is scanned (the channel in the upper row of the coupler, as shown in FIG. 3), and the other of which is used for transmitting data when coils are decoupled (the channel in the lower row of the coupler, as shown in FIG. 3). Each time the method 200 is executed, the controller 110 may select two coils having a high coupling degree, for example, the coil N1 and the coil N2, from the plurality of coils N1, N2, . . . , Nn as two coils to be adjusted according to the degree of coupling between two adjacent coils of the plurality of coils N1, N2, . . . , Nn. In this case, the controller 110 may send an instruction controlling the toggling of the switches S1 and S2 of the channel selection portions X1 and X2 of the coil N1 and the coil N2 to the lower positions (namely, the channels connected to the couplers D1 and D2 and used for transmitting data when the coils are decoupled) and controlling the connection of the transmitter 120 to the channel selection portion X1 and the connection of the receiver 130 to the channel selection portion X2. In this case, the coil N1 may serve as the transmitting coil to receive a transmitted signal sent by the transmitter 120, and the coil N2 may serve as the receiving coil to receive a signal sent by the transmitting coil. Thus, on the one hand, two coils having a high degree of coupling may be selected for decoupling to improve the efficiency of decoupling operations and reduce the use of computation resources. On the other hand, since the distance between coils is an important factor influencing the degree of coupling, a decoupling operation is performed only for adjacent coils in the above-mentioned embodiments. Thus, the efficiency of the decoupling operation may be improved, and the waste of computation resources may be reduced. It should be noted here that any two coils may be selected from the plurality of coils as the two coils to be adjusted based on the degree of coupling of the two coils of the plurality of coils. The disclosure is not limited to such a selection.

In some embodiments, the method 200 may be executed each time before the magnetic resonance imaging device starts scanning. Thus, coils may be decoupled in real time according to different application scenarios (for example, when different parts of a human body are scanned) of the magnetic resonance imaging device to improve the decoupling effect and the magnetic resonance imaging quality. For example, the operator of the magnetic resonance imaging device may press a corresponding button in the magnetic resonance imaging device to trigger the execution of the method 200 before the magnetic resonance imaging device starts scanning. For a further example, the magnetic resonance imaging device may further automatically detect whether an object under test exists in the magnetic resonance imaging device, and automatically execute the method 200 when detecting that an object under test exists in the magnetic resonance imaging device. Specifically, Step S202 of sending an instruction causing a transmitter to send a transmitted signal may comprise: determining whether an object under test exists in the magnetic resonance imaging device, and sending an instruction causing the transmitter to send a transmitted signal in response to a determining that an object under test exists in the magnetic resonance imaging device, wherein, the existence of an object under test in the magnetic resonance imaging device may, for example, be sensed by a sensor (for example, a camera or an infrared sensor). In this case, the controller 110 can receive signals sensed by the sensor and determine whether an object under test exists in the magnetic resonance imaging device based on the sensed signals. Here, it should be noted that the method 200 may further be executed during a scanning process of the magnetic resonance imaging device or in a fixed period of time each day. When the method is executed, it is not limited to those listed herein.

In some embodiments, the coupling value between two coils to be adjusted may be calculated based on the parameters such as powers, voltages or currents of signals. For example, Step 206 may comprise determining the coupling value between two coils to be adjusted based on the difference between the power of the transmitted signal and the power of the received signal. Calculating the coupling value between coils based on the power of signals can accurately reflect the degree of coupling between coils.

In other embodiments, Step 206 may comprise determining the coupling value between two coils to be adjusted based on a transmitted signal, a received signal and calibration data, wherein the calibration data is determined based on a signal coming from the transmitter to the receiver but not passing through the plurality of coils. For the signals, which have the same transmission path as the transmitted signals during the decoupling operation except that they do not pass through the coils, the values calculated from the transmitted signal and the received signal are calibrated to eliminate the influence of other factors than coil coupling on the coupling value, and thus the degree of coupling between the two coils to be adjusted can be more accurately determined. For example, in the system shown in FIG. 1, the signal for calculating calibration data starts from the transmitter 120, passes through the channel selection portion X1, directly arrives at the channel selection portion X2, and is then received by the receiver 130. Different from the transmission path of the transmitted signal during the decoupling operation, the transmission path of the signal is arriving at the channel selection portion X2 directly from the channel selection portion X1 without passing through the coils N1 and N2.

In some embodiments, calibration data is determined based on a calibration signal sent by the transmitter and a signal received by the receiver that corresponds to the calibration signal, and is determined in a similar way to that in which the coupling value is determined based on the transmitted signal and the received signal so as to eliminate the influence of other factors than coil coupling on the coupling value and improve the accuracy of the calculated degree of coupling between coils.

In some embodiments, the calculation of calibration data may be performed each time before or during the execution of the method 200, or calibration data may be pre-calculated and stored in the magnetic resonance imaging device, and pre-calculated calibration data may directly be invoked each time the method 200 is executed.

Figure 5:
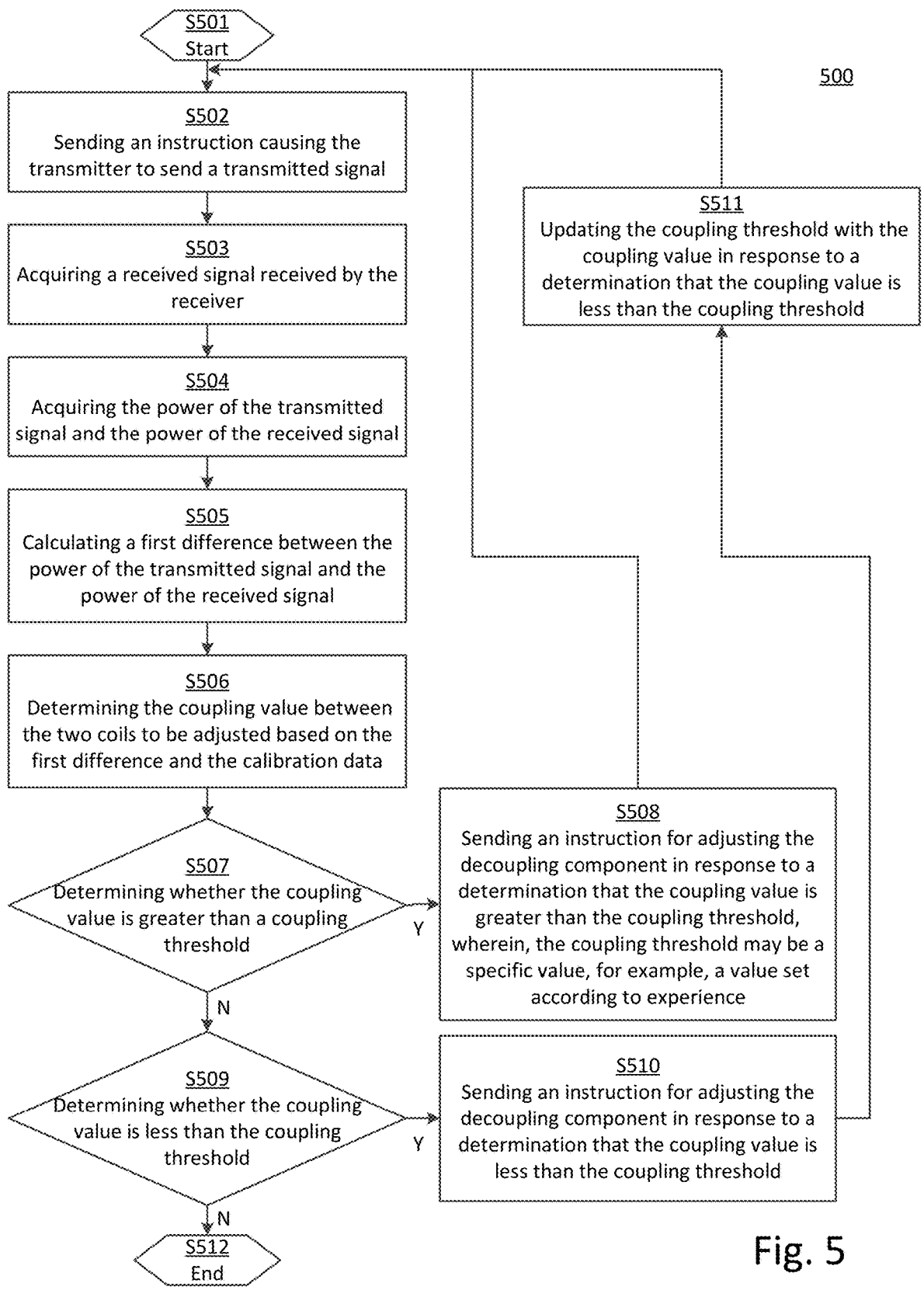
FIG. 5 is a flowchart of the coil decoupling method for a magnetic resonance imaging device according to other embodiments of the disclosure.

FIG. 5 is a flowchart of the coil decoupling method 500 for a magnetic resonance imaging device according to other embodiments of the disclosure. The method 500 starts with Step S500. The method 500 shown in FIG. 5 comprises: Step S502, sending an instruction causing the transmitter to send a transmitted signal, and Step S503, acquiring a received signal received by the receiver. The features of Steps S502 and S503 of the method 500 are the same as the features of Steps S202 and S204 of the method 200. For the sake of simplicity, these features will not be described here again. The differences between the method 500 and the method 200 will mainly be described below. As shown in FIG. 5, determining the coupling value between two coils to be adjusted based on a transmitted signal, a received signal and calibration data may comprise: Step S504, acquiring the power of the transmitted signal and the power of the received signal, Step S505, calculating a first difference between the power of the transmitted signal and the power of the received signal, and Step S506, determining the coupling value between the two coils to be adjusted based on the first difference and the calibration data. By calculating the difference between the power of the transmitted signal and the power of the received signal, the degree of coupling between the two coils to be adjusted can accurately be reflected, and thus the decoupling effect of the coils and the magnetic resonance imaging performance are improved. Here, it should be understood that the coupling value may also be calculated based on the voltage or current of a signal, and the calculation of the coupling value is not limited to those listed herein. It should also be understood that the coupling value between two coils to be adjusted may also be calculated based on the ratio between the power of the transmitted signal and the power of the received signal and the calculation of the coupling value is not limited to those listed herein. In other embodiments, Step S505 may be omitted, that is to say, the coupling value between two coils to be adjusted may directly be calculated based on the power of the transmitted signal, the power of the received signal and the calibration data.

In some embodiments, the calibration data is determined based on a signal coming from the transmitter to the receiver but not passing through the plurality of coils. For example, in the system shown in FIG. 1, the signal for calculating calibration data starts from the transmitter 120, passes through the channel selection portion X1 and the channel selection portion X2, and arrives at the receiver 130. The signal calculating calibration data has the same transmission path as that of the transmitted signal except for passing through the coils N1 and N2.

In some embodiments, calibration data is determined based on a calibration signal sent by the transmitter and a signal received by the receiver that corresponds to the calibration signal, and is determined in a similar way to that in which the coupling value is determined based on the transmitted signal and the received signal so as to eliminate the influence of other factors than coil coupling on the coupling value and improve the accuracy of the calculated degree of coupling between coils.

In some embodiments, when the coupling value is calculated based on the first difference between the power of the transmitted signal and the power of the received signal, calibration data may comprise a second difference between the power of the calibration signal sent by the transmitter and the power of the signal received by the receiver that corresponds to the calibration signal, and calibration data is determined in a similar way to that in which the coupling value is determined based on the transmitted signal and the received signal so as to eliminate the influence of other factors than coil coupling on the coupling value and improve the accuracy of the calculated degree of coupling between coils. For example, in the system shown in FIG. 1, the calibration signal starts from the transmitter 120, passes through the channel selection portion X1, directly arrives at the channel selection portion X2, and is then received by the receiver 130. Calibration data may be a second difference between the power of the calibration signal and the power of the calibration signal arriving at the receiver 130 after passing through the channel selection portions X1 and X2. In other embodiments, when the coupling value is calculated based on the ratio between the power of the transmitted signal and the power of the received signal, calibration data may comprise the ratio between the power of the calibration signal sent by the transmitter and the power of the signal received by the receiver that corresponds to the calibration signal.

In some embodiments, the calculation of calibration data may be performed each time before or during the execution of the method 500, or calibration data may be pre-calculated and stored in the magnetic resonance imaging device, and pre-calculated calibration data may directly be invoked each time the method 500 is executed.

In some embodiments, as shown in FIG. 5, Step S208 of sending an instruction for adjusting the decoupling component based on the coupling value may comprise: Step S507, determining whether the coupling value is greater than a coupling threshold, and Step S508, sending an instruction for adjusting the decoupling component in response to a determination that the coupling value is greater than the coupling threshold, wherein, the coupling threshold may be a specific value, for example, a value set according to experience. For example, in the system shown in FIG. 1, when the calculated coupling value between the two coils N1 and N2 to be adjusted is greater than the coupling threshold, the controller 110 sends an instruction for adjusting the decoupling component 140. Adjusting the decoupling component only when the coupling value is determined to be greater than the coupling threshold can improve the coil decoupling efficiency and reduce the waste of computation resources.

In some embodiments, after performing Steps S507 and S508, the method 500 may further comprise performing a step of sending an instruction causing the transmitter to send a transmitted signal in response to a determination that the coupling value is greater than the coupling threshold, namely, going back to perform Step S502, and performing Steps S503, S504 and S505 in sequence, etc. Thus, if the coupling value is determined to be greater than the coupling threshold, after sending an instruction for adjusting the decoupling component, the controller may go back to perform Steps S502, S503, S504, etc., to determine the degree of coupling between the two coils to be adjusted after the decoupling and determine whether to perform decoupling again based on the degree of coupling after the decoupling. In this way, real-time feedback may be obtained during decoupling, and decoupling may be performed again according to the feedback. The decoupling step is performed continuously to increase the decoupling effect.

Figure 6:
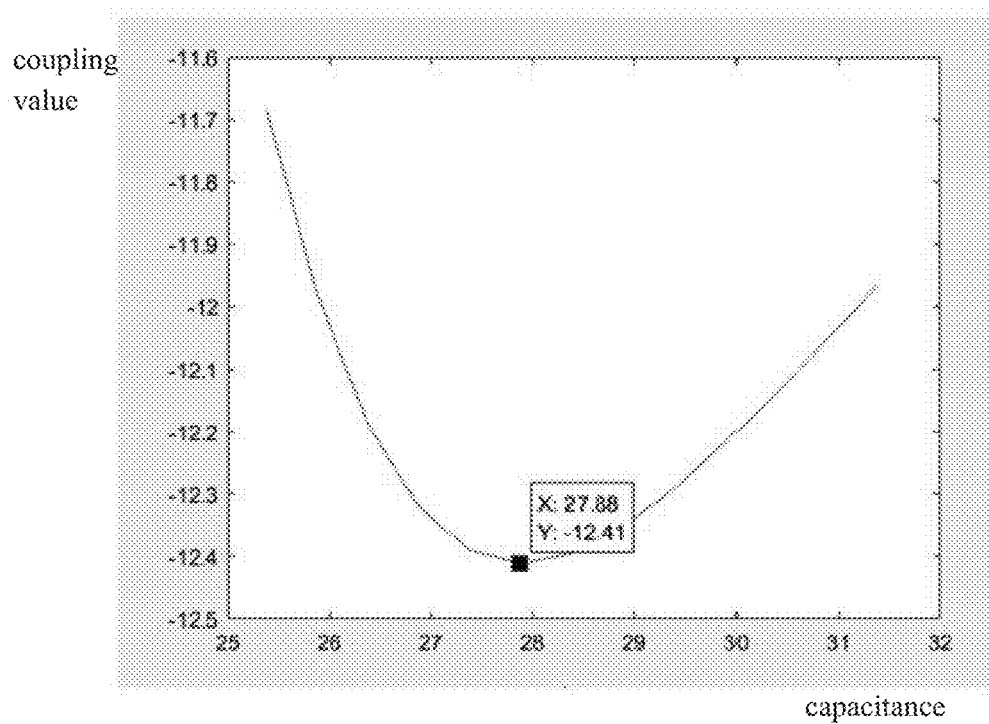
FIG. 6 exemplarily shows the relationship between the coupling value between coils and the parameters of the decoupling component.

In some embodiments, when determining that the coupling value is less than or equal to the coupling threshold, the controller may perform Step S512 of ending the method. Alternatively, besides Steps S507 and S508, Step S208 may further comprise Step S509, determining whether the coupling value is less than the coupling threshold and Step S510, sending an instruction for adjusting the decoupling component in response to a determination that the coupling value is less than the coupling threshold. In this case, the method 500 may further comprise Step S511, updating the coupling threshold with the coupling value in response to a determination that the coupling value is less than the coupling threshold; and performing Step S502, sending an instruction causing the transmitter to send a transmitted signal, in response to the determination that the coupling value is less than the coupling threshold. For example, in the system shown in FIG. 1, when the coupling value is determined to be less than the coupling threshold, the pre-stored coupling threshold th is updated with the calculated coupling value h1 (that is to say, coupling threshold th=h1) and the controller 110 continues to send an instruction for adjusting the decoupling component 140 and an instruction causing the transmitter 120 to send a transmitted signal. In this way, after performing Steps S502, S503, S504, S505 and S506, the controller determines whether a decoupling operation (namely, sending an instruction for adjusting the decoupling component 140) is required again between the two coils to be adjusted based on the updated coupling threshold th=h1 after the decoupling component 140 is adjusted. This is because studies show that the coupling value has a lowest point in a certain range of the parameter of the decoupling component. Therefore, the above-mentioned way is used to find the lowest point of the coupling value through continuous iterations and the parameter of the decoupling component corresponding to the minimum is used to adjust the decoupling component. As shown in FIG. 6 (the horizontal coordinate represents the capacitance of a capacitor and the vertical coordinate represents a coupling value), a lowest decoupling value of −12.41 dB can be obtained to achieve the best decoupling effect when the capacitance of the capacitor serving as the decoupling component is adjusted to 27.88 pF in a certain range of the capacitance of the capacitor. Thus, the best decoupling effect can be obtained by finding the lowest coupling value through the continuous iterations and dynamic updating of the coupling value according to decoupling adjustments between coils.

In other embodiments, Step S208 may comprise determining the adjustment amount of the decoupling component based on the coupling value and sending the adjustment amount to the decoupling component. For example, in the system shown in FIGS. 3 and 4, when the decoupling component 140 is a voltage-controlled capacitor $C_{d31}$, the controller 110 may determine the control voltage of the voltage-controlled capacitor $C_{d31}$ based on the coupling value and send an instruction containing the control voltage to the voltage-controlled capacitor $C_{d31}$. Thus, the adjustment of the decoupling component in the magnetic resonance imaging device according to the calculated coupling value is realized, and the coils are effectively decoupled in real time.

Here, it should be noted that the steps and features in the methods 200 and 500 according to the above-mentioned embodiments of the disclosure may be omitted or equivalently replaced or added. For example, Steps S504, S505 and S506 described in FIG. 5 may be added to Step S206 described in FIG. 2, Steps S507, S508, S509 and S510 described in FIG. 5 may be added to Step S208 described in FIG. 2, and Step S511 described in FIG. 5 may be added to the method 200 described in FIG. 2.

Figure 7:
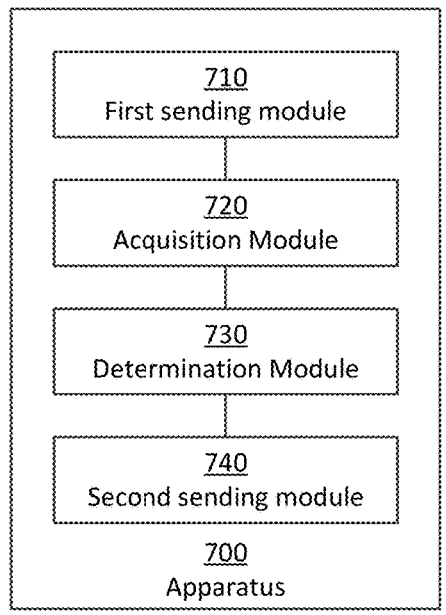
FIG. 7 is a schematic block diagram of the coil decoupling apparatus for a magnetic resonance imaging device according to some embodiments of the disclosure.

FIG. 7 is a schematic block diagram of the coil decoupling apparatus 700 for a magnetic resonance imaging device according to some embodiments of the disclosure. As shown in FIG. 7, the apparatus 700 comprises a first sending module 710, an acquisition module 720, a determination module 730 and a second sending module 740. The first sending module 710 is configured to send an instruction causing the transmitter to send a transmitted signal. The acquisition module 720 is configured to acquire a received signal received by the receiver, wherein the received signal is a signal arriving at the receiver after the transmitted signal passes through two coils to be adjusted of the plurality of coils. The determination module 730 is configured to determine the coupling value between the two coils to be adjusted based on the transmitted signal and the received signal. The second sending module 740 is configured to send an instruction for adjusting the decoupling component based on the coupling value. The degree of coupling between coils is calculated based on the transmitted signal and the received signal passing through the coils, and the decoupling component in the magnetic resonance imaging device is adjusted according to the degree of coupling so that the coils are effectively decoupled in real time, and the influence of the factors such as load on the decoupling effect is reduced, and thus the magnetic resonance imaging performance is improved.

It should be understood that the modules of the apparatus 700 shown in FIG. 7 may correspond to the steps of the methods 200 and 500 described in FIG. 2 and FIG. 5. Thus, the operations, features and advantages described for the methods 200 and 500 are also applicable to the apparatus 700 and the modules thereof. For the sake of simplicity, some operations, features and advantages are not described here again.

According to yet another aspect of the disclosure, an electronic device is provided. The electronic device comprises a processor and a memory storing a program. The program comprises instructions and the instructions cause the processor to perform the steps of the method 200 or 500 described above when executed by the processor.

According to yet another aspect of the disclosure, a non-transient computer-readable storage medium storing a program is provided. The program comprises instructions and the instructions cause one or more processors to perform the steps of the method 200 or 500 described above when executed by the one or more processors.

According yet another aspect of the disclosure, a computer program product is provided. The computer program product comprises a computer program and the computer program performs the steps of the method 200 or 500 described above when executed by a processor.

Illustrative examples of the electronic device, the non-transient computer-readable storage medium and the computer program product are described below in combination with FIG. 8.

Figure 8:
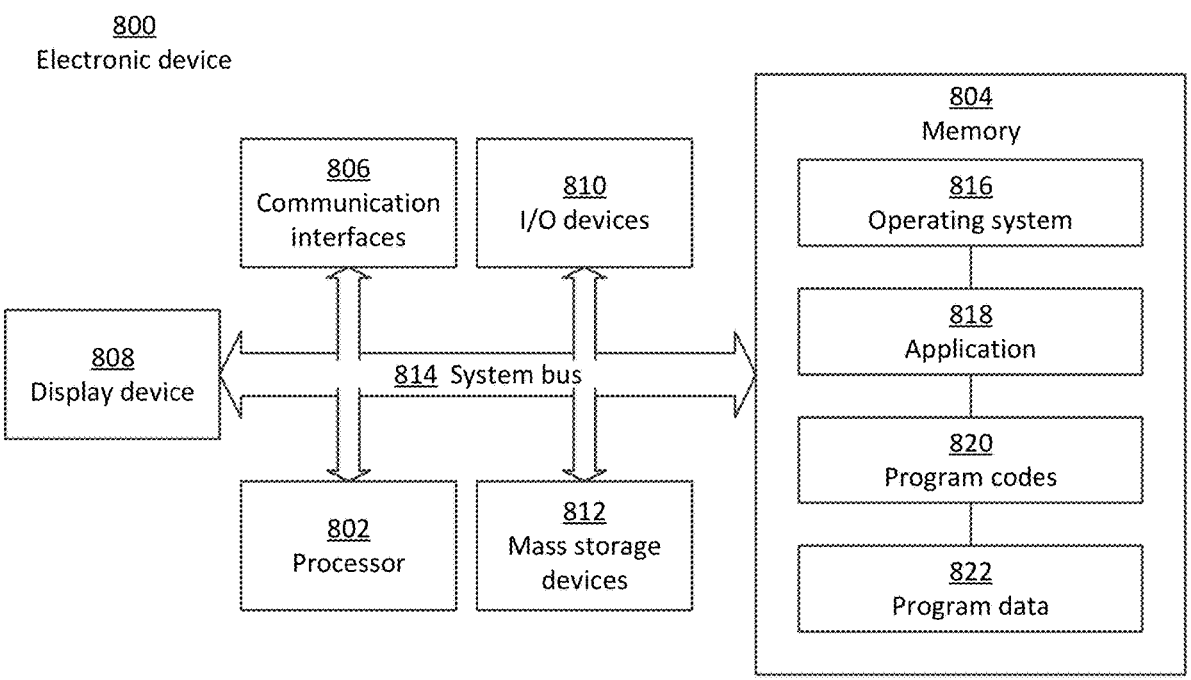
FIG. 8 shows an exemplary configuration of the electronic device which may be used to execute the method described in this document.

FIG. 8 shows an exemplary configuration of the electronic device 800 which may be used to execute the method described in this document. The coil decoupling apparatus for a magnetic resonance imaging device may completely or partially be implemented by the electronic device 800 or a similar device or system.

The electronic device 800 may be one of different types of devices, for example, a server of a service provider, a device associated with a client (for example, a client device), a system on a chip, and/or any other proper computer device or computer system. Examples of the electronic device 800 include but are not limited to a desktop computer, a server computer, a notebook computer or a netbook computer, a mobile device (for example, tablet personal computer, cellular phone, a wireless phone (for example, a smart phone), a notepad computer and a mobile station), etc.

The electronic device 800 may comprise at least one processor 802, a memory 804, (a plurality of) communication interfaces 806, a display device 808, other input/output (I/O) devices 810 and one or more mass storage devices 812 which can communicate with each other through a system bus 814 or other proper connections.

The processor 802 may be a single processing unit or a plurality of processing units, and all processing units may comprise a single or a plurality of computing units or cores. The processor 802 may be implemented as one or more microprocessors, microcomputers, microcontrollers, digital signal processors, central processing units, state machines, logic circuits and/or any device controlling signals based on operation instructions. Besides other capabilities, the processor 802 may be configured to acquire and execute computer-readable instructions, such as program codes of an operating system 816, program codes of an application 818 or program codes of other programs 820, stored in the memory 804, the mass storage device 812 or other computer-readable mediums.

The memory 804 and the mass storage device 812 are examples of computer-readable storage media for storing instructions, and the instructions are executed by the processor 802 to implement the functions described previously. For example, the memory 804 may generally be a volatile memory or a nonvolatile memory (for example, RAM and ROM). In addition, the mass storage device 812 may generally be a hard disk drive, a solid state drive, a removable medium, an external removable drive, a memory card, a flash, a floppy disk, an optical disk (for example, CD or DVD), a storage array, a network attached storage, and a storage area network, etc. The memory 804 and the mass storage device 812 may both be referred to as a memory or a computer-readable storage medium in this document, and may be a non-transient medium which can store computer-readable and processor-executable program instructions as computer program codes, and the computer program codes may be executed by the processor 802 configured as specific machines to implement the operations and functions described in the examples in the document.

A plurality of program modules may be stored in the mass storage device 812. The programs include the operating system 816, one or more applications 818, other programs 820 and program data 822, and in addition, these programs may be loaded into the memory 804 to be executed. Examples of such applications or program modules may include, for example, the computer program logics (for example, computer program codes or instructions) implementing the following component/functions: the apparatus 700 (including the first sending module 710, the acquisition module 720, the determination module 730 and the second sending module 740), the method 200 (including any proper step of the method 200), the method 500 (including any proper step of the method 500) and/or other embodiments described in the document.

Although FIG. 8 shows that the modules 816, 818, 820 and 822 or other parts are stored in the memory 804 of the electronic device 800, they may be stored in a computer-readable medium in any form the electronic device 800 can access. As used in the document, "the computer-readable medium" comprises at least two types of computer-readable media, namely, computer storage medium and communication medium.

Computer storage media comprise volatile and nonvolatile, removable and non-removable media implemented through any method or technique for storing information, and the information is, for example, computer-readable instructions, data structures, program modules or other data. The computer storage media include but are not limited to RAM, ROM, EEPROM, flash or other memory techniques, CD-ROM, digital versatile disk (DVD), or other optical storage devices, magnetic cartridges, magnetic tapes, disk storage devices or other magnetic storage devices, or any other non-transmitting media for storing information to be accessed by a computer device.

Correspondingly, communication media may specifically implement computer-readable instructions, data structures, program modules or other data in data signals invoked by carriers or other transmission mechanisms, for example. The computer storage media defined in the document exclude communication media.

The electronic device 800 may further comprise one or more communication interfaces 806, and they are used for exchanging data with other devices through a network connection or a direct connection, for example, as discussed previously. Such communication interfaces may be one or more of the following: any type of network interface (for example, network interface card (NIC), wired or wireless (for example, IEEE 802.11 wireless LAN (WLAN)) interface, world interoperability for microwave access (WiMAX) interface, Ethernet interface, universal serial bus (USB) interface, cellular network interface, Bluetooth™ interface, near field communication (NFC) interface, and the like. The communication interfaces 806 may promote communication of different protocol types in various networks, including wired networks (for example, LAN and cable) and wireless networks (for example, WLAN, cellular network, and satellite) and the Internet. The communication interfaces 806 may further provide communication with an external storage device (not shown) in a storage array, a network attached storage, or a storage area network.

In some examples, the electronic device may comprise a display device 808 such as a monitor, and the display device is used to display information and images to a user, for example, display a prompt indicating that coil decoupling is in progress or is completed, etc. Other I/O devices 810 may be devices that receive various inputs from the user and provide various outputs for the user, and may include touch input devices, gesture input devices, cameras, keyboard, remote controllers, mice, printers and audio input/output devices, etc.

The above are only embodiments of the disclosure and are not used to restrict the disclosure. Any modification, equivalent replacement and improvement made within the spirit and principle of the disclosure should fall within the scope of protection of the disclosure.

The invention claimed is:

1. A coil decoupling method for a magnetic resonance imaging device, the magnetic resonance imaging device comprising a transmitter, a receiver, a decoupling component and a plurality of coils, the method comprising:
    sending an instruction causing the transmitter to send a transmitted signal;
    acquiring a received signal received by the receiver, wherein the received signal is the transmitted signal that arrives at the receiver after passing through two coils to be adjusted of the plurality of coils, wherein one of the two coils to be adjusted is a transmitting coil operable to receive the transmitted signal sent by the transmitter, and the other of the two coils to be adjusted is a receiving coil operable to receive the signal sent by the transmitting coil;
    determining a coupling value between the two coils to be adjusted based on the transmitted signal and the received signal; and
    in response to a determination that the coupling value is less than a coupling threshold, sending an instruction for adjusting the decoupling component based on the coupling value, updating the coupling threshold with the coupling value, and sending another instruction causing the transmitter to send another transmitted signal.

2. The method according to claim 1, wherein the determining the coupling value between the two coils to be adjusted based on the transmitted signal and the received signal comprises:
    determining the coupling value between the two coils to be adjusted based on the transmitted signal, the received signal and calibration data, wherein the calibration data is determined based on a signal from the transmitter to the receiver but not passing through the plurality of coils.

3. The method according to claim 2, wherein the calibration data is determined based on a calibration signal sent by the transmitter and a signal received by the receiver and corresponding to the calibration signal.

4. The method according to claim 3, wherein the determining the coupling value between the two coils to be adjusted based on the transmitted signal, the received signal and calibration data comprises:
    acquiring a power of the transmitted signal and a power of the received signal;
    calculating a first difference between the power of the transmitted signal and the power of the received signal; and
    determining the coupling value between the two coils to be adjusted based on the first difference and the calibration data.

5. The method according to claim 4, wherein the calibration data comprises a second difference between a power of the calibration signal sent by the transmitter and the power of the signal received by the receiver that corresponds to the calibration signal.

6. The method according to claim 1, wherein the sending an instruction for adjusting the decoupling component based on the coupling value comprises:
    determining whether the coupling value is greater than the coupling threshold; and
    sending an instruction for adjusting the decoupling component in response to a determination that the coupling value is greater than the coupling threshold.

7. The method according to claim 6, further comprising:
    executing the sending the instruction causing the transmitter to send a transmitted signal in response to a determination that the coupling value is greater than the coupling threshold.

8. The method according to claim 1, wherein the sending an instruction for adjusting the decoupling component based on the coupling value comprises:
    determining an adjustment amount for the decoupling component based on the coupling value; and
    sending the adjustment amount to the decoupling component.

9. The method according to claim 1, wherein the decoupling component is a decoupling component disposed between the two coils to be adjusted.

10. The method according to claim 1, wherein the sending an instruction causing the transmitter to send a transmitted signal comprises:
    determining whether an object under test exists in the magnetic resonance imaging device; and
    sending an instruction causing the transmitter to send a transmitted signal in response to a determination that the object under test exists in the magnetic resonance imaging device.

11. The method according to claim 1, the method further comprising:

selecting two coils from the plurality of coils as the two coils to be adjusted based on a degree of coupling between two adjacent coils of the plurality of coils; and sending an instruction for connecting the transmitting coil to the transmitter and connecting the receiving coil to the receiver.

12. An electronic device, comprising:

a processor; and a memory storing a program comprising instructions, wherein the instructions cause the processor to execute the method according to claim 1 when executed by the processor.

13. A non-transient computer-readable storage medium storing a program comprising instructions for executing the method according to claim 1 when the instructions are executed by one or more processors.

14. A coil decoupling apparatus for a magnetic resonance imaging device, the magnetic resonance imaging device comprising a transmitter, a receiver, a decoupling component and a plurality of coils, the coil decoupling apparatus comprising:

a first sending module configured to send an instruction causing the transmitter to send a transmitted signal;

an acquisition module configured to acquire a received signal received by the receiver, wherein the received signal is the transmitted signal arriving at the receiver after passing through two coils to be adjusted of the plurality of coils, wherein one of the two coils to be adjusted is a transmitting coil operable to receive the transmitted signal sent by the transmitter, and the other of the two coils to be adjusted is a receiving coil operable to receive the signal sent by the transmitting coil;

a determination module configured to determine a coupling value between the two coils to be adjusted based on the transmitted signal and the received signal; and a second sending module configured to, in response to a determination that the coupling value is less than a coupling threshold, send an instruction for adjusting the decoupling component based on the coupling value, update the coupling threshold with the coupling value, and send another instruction causing the transmitter to send another transmitted signal.

* * * * *